United States Patent
Eastty et al.

(10) Patent No.: US 6,593,866 B1
(45) Date of Patent: *Jul. 15, 2003

(54) SIGNAL PROCESSORS

(75) Inventors: Peter Charles Eastty, Eynsham (GB); Peter Damien Thorpe, Botley (GB); Christopher Sleight, Chipping Norton (GB)

(73) Assignee: Sony United Kingdom Limited, Weybridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 09/178,187

(22) Filed: Oct. 23, 1998

(30) Foreign Application Priority Data

Oct. 24, 1997 (GB) .............................................. 9722529

(51) Int. Cl.⁷ ................................................ H03M 3/00
(52) U.S. Cl. ......................... 341/143; 341/76; 341/155
(58) Field of Search ................................ 341/143, 155, 341/76, 77

(56) References Cited

U.S. PATENT DOCUMENTS 6,028,946 A * 2/2000 Jahne ......................... 381/122
6,078,621 A * 6/2000 Eastty et al. ................. 341/143

FOREIGN PATENT DOCUMENTS

| DE | 196 06 261 A1 | * 8/1997 | ............ H04R/3/00 |
| GB | 2 233 518 | 1/1991 | |

* cited by examiner

Primary Examiner—Howard L. Williams
(74) Attorney, Agent, or Firm—Frommer Lawrence & Haug LLP; William S. Frommer; Darren M. Simon

(57) ABSTRACT

A differential microphone (50) produces a differential pair of output signals which are applied by a differential analogue amplifier (52). The amplified differential signals are converted to 1-bit form by a pair of analogue to digital converters (54, 55) and are combined in a 1-bit Delta Sigma Modulator.

12 Claims, 3 Drawing Sheets

SIGNAL PROCESSORS

BACKGROUND OF THE INVENTION

1. Field of the Invention

The present invention relates to a 1-bit signal processor.

2. Description of the Prior Art

It has been proposed to process 1-bit signals with Delta Sigma Modulators (DSM). The 1-bit signals may be audio signals and the invention is described herein by way of example with reference to audio signals.

Background to the present invention will now be described by way of example with reference to FIGS. 1, 2 and 3 of the accompanying drawings of which FIG. 1 is a block diagram of a known Delta-Sigma Modulator, FIG. 2 is a block diagram of a previously proposed Delta-Sigma Modulator configured as an nth order filter section and FIG. 3 shows a noise shaping characteristic.

It is known to convert an analogue signal to a digital form by sampling the analogue signal at at least the Nyquist rate and encoding the amplitudes of the samples by an m bit number. Thus if m=8, the sample is said to be quantized to an accuracy of 8 bits. In general m can be any number of bits equal to or greater than 1.

For the purpose of quantizing to only 1 bit, it is known to provide an analogue to digital converter (ADC) known either as a "Sigma-Delta ADC" or as a "Delta-Sigma ADC". Herein the term "Delta-Sigma" is used. Such an ADC is described in for example "A Simple Approach to Digital Signal Processing" by Craig Marven and Gillian Ewers ISBN 0-904.047-00-8 published 1993 by Texas Instruments.

Referring to FIG. 1 in an example of such an ADC, the difference 1 (Delta) between an analogue input signal and the integral 2 (Sigma) of the 1-bit output signal is fed to a 1-bit quantizer 3. The output signal comprises bits of logical value 0 and 1 but representing actual values of −1 and +1 respectively. The integrator 3 accumulates the 1-bit outputs so that value stored in it tends to follow the value of the analog signal. The quantizer 3 increases (+1) or reduces (−1) the accumulated value by 1-bit as each bit is produced. The ADC requires a very high sampling rate to allow the production of an output bit stream the accumulated value of which follows the analogue signal.

The term "1-bit" signal as used in the following description and in the claims means a signal quantized to an accuracy of 1 digital bit such as is produced by a Delta-Sigma ADC.

A Delta-Sigma Modulator (DSM) configured as nth order filter section for directly processing a 1-bit signal was proposed by N. M. Casey and James A. S. Angus in a paper presented at 95th AES Convention Oct. 7–10, 1993 New York, USA entitled "One Bit Digital Processing of Audio Signals"—Signal Processing: Audio Research Group, The Electronics Department, The University of York, Heslington, York YO1 5DD England. FIG. 2 shows a 3rd order (n=3) version of such a DSM filter section.

Referring to FIG. 2, the DSM has an input 4 for a 1-bit audio signal and an output 5 at which a processed a 1-bit signal is produced. The bits of the 1-bit signal are clocked through the DSM by known clocking arrangements which are not shown. The output 1-bit signal is produced by a 1-bit quantizer Q which is for example a comparator having a threshold level of zero. The DSM has three stages each comprising a first 1-bit multiplier $a_1$, $a_2$, $a_3$ connected to the input 4, a second 1-bit multiplier $c_1$, $c_2$, $C_3$ connected to the output 5, an adder $6_1$, $6_2$, $6_3$ and an integrator $7_1$, $7_2$, $7_3$.

The 1-bit multipliers multiply the received 1-bit signal by p bit coefficients $A_1$, $A_2$, $A_3$, $C_1$ $C_2$, $C_3$ producing p bit products which are added by the adders $6_1$, $6_2$, $6_3$ and the sums passed to the integrators 7. In the intermediate stages the adders $6_2$, $6_3$ also sum the output of the integrator of the preceding stage. A final stage comprises another 1-bit multiplier $A_4$ connected to the input which multiplies the input signal by a p bit coefficient $A_4$ and an adder $6_4$ which adds the product to the output of the integrator $7_3$ of the preceding stage. The sum is passed to the quantizer Q.

Within the DSM, two's complement arithmetic is used to represent the positive and negative p bit numbers. The input to the quantizer Q may be positive, quantized at the output as +1 (logical 1) or negative quantized at the output as −1 (logical 0).

As observed by Casey and Angus "a one bit processor . . . will produce a one bit output that contains an audio signal that is obscured by noise to an unacceptable level and it is imperative the quantization noise is suitably shaped". The noise which obscures the audio signal is the quantization noise produced by the quantizer Q.

The quantizer Q may be modelled as an adder which has a first input receiving an audio signal and a second input receiving a random bit stream (the quantization noise) substantially uncorrelated with the audio signal. Modelled on that basis, the audio signal received at the input 4 is fed forward by multipliers $a_1$, $a_2$, $a_3$, $a_4$ to the output 5 and fed back by multipliers $c_1$, $c_2$, $c_3$ from the output 5. Thus coefficients A1 to A4 in the feed forward path define zeros of the Z-transform transfer function of the audio signal and coefficients C1–C3 in the feed back path define poles of the transfer function of the audio signal.

The noise signal is fed-back from the quantizer by the multipliers $C_1$–$C_3$ so that coefficients C1–C3 define poles of the transfer function of the noise signal. The transfer function of the noise signal is not the same as the transfer function of the input signal.

The coefficients A1 to A4 and C1 to C3 are chosen to provide circuit stability amongst other desired properties.

The coefficients C1–C3 are chosen to provide noise shaping so as to minimise quantization noise in the audio band, as shown for example in FIG. 3 by the full line 31.

The coefficients A1–A4 and C1–C3 are also chosen for a desired audio signal processing characteristic.

The coefficients A1–A4 and C1–C3 may be chosen by:
a) finding the Z-transform H(z) of the desired filter characteristic—e.g noise shaping function; and
b) transforming H(z) to coefficients.
This may be done by the methods described in the paper
"Theory and Practical Implementation of a Fifth Order Sigma-Delta A/D Converter, Journal of Audio Engineering Society, Volume 39, no. 7/8, 1991 July/August by R. W Adams et al."
and in
the paper by Casey and Angus mentioned herein above using the knowledge of these skilled in the art. One way of calculating the coefficients is outlined in the accompanying Annex A.

The various papers mentioned herein above consider only nth order filter sections.

For high quality audio recording it is conventional to use a microphone having a differential or double-ended analogue output. Proposed 1-bit signal processors including DSMs require non-differential or single-ended signals. One proposal for converting differential signals to non-differential signals is to add using an analogue adder the analogue differential signals output by the microphone and then converting the resultant non-differential signal to 1-bit digital form.

SUMMARY OF THE INVENTION

According to the present invention there is provided a signal processor having a pair of inputs for receiving first and second analogue signals which are a differential pair of signals,
- a pair of 1-bit analogue to digital converters coupled to the respective inputs to convert the first and second signals to 1-bit digital form, and
- a Delta Sigma Modulator having a pair of inputs coupled to receive the respective first and second 1-bit signals for combining the differential pair to form a non-differential 1-bit signal.

In a preferred embodiment of the invention the pair of input signals are produced by an audio signal source such as a differential microphone. By converting the two differential analogue outputs of the microphone to corresponding 1-bit signals and then combining the two 1-bit signals in a DSM, the signal to noise ratio is improved (compared to the prior proposal discussed above). The improvement arises because both the noise in the differential analogue signals and the quantization noise produced in the analogue to digital converters is uncorrelated and so both types of noise are reduced relative to the signal in the DSM combiner.

In a preferred embodiment of the present invention, the Delta Sigma Modulator comprises an nth order (where n is greater than or equal to 1) Delta Sigma Modulator having a first input for receiving a first 1-bit signal, a second input for receiving a second 1-bit signal, a quantizer for requantizing a p bit signal to 1-bit form the requantized signal being the output signal of the processor, a plurality of signal combiners including a first combiner for forming an integral of an additive combination of the product of the first signal and a first coefficient and of the product of the second signal and a second coefficient and of the product of the output signal and a third coefficient, at least one intermediate combiner for forming an integral of an additive combination of the product of the first signal and a first coefficient and of the product of the second signal and a second coefficient and of the product of the output signal and a third coefficient and of the integral of the preceding stage, and a final combiner for forming an additive combination of the product of the first signal and a first coefficient and of the product of the second signal and a second coefficient and of the integral of the preceding stage to form the said p bit signal which is requantized by the quantizer.

Thus the DSM combines the first and second signals. Coefficients multiplies of the said combiners operate on 1-bit signals and so coefficient multiplication is performed as 1-bit multiplication avoiding the need for p bit multipliers which are uneconomic.

Furthermore the DSM also provides noise shaping.

The said first and second coefficients applied to the first and second signals may be fixed in which case the DSM acts as an adder which adds the first and second signals in fixed proportions defined by the said coefficients.

The said first and second coefficients applied to the first and second signals may be variable in which case the DSM acts as a mixer and/or fader.

The first and second coefficients define zeroes of the input signal transfer function and may be fixed or variable, but the third coefficients define poles of the input signal transfer function and are fixed.

BRIEF DESCRIPTION OF THE DRAWINGS

The above and other objects, features and advantages of the invention will be apparent from the following detailed description of illustrative embodiments which is to be read in connection with the accompanying drawings, in which.

DESCRIPTION OF THE PREFERRED EMBODIMENTS

Figure 1:
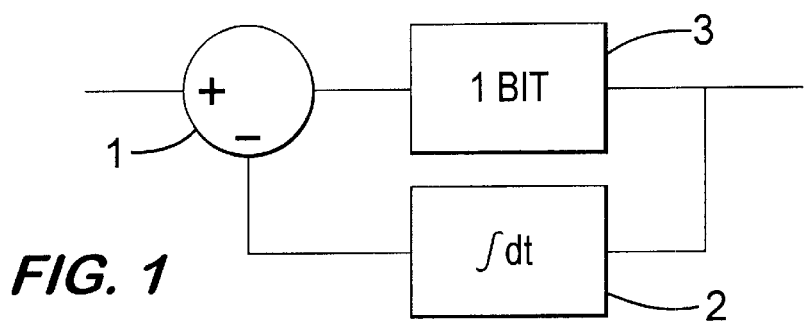
FIG. 1 is a block diagram of a known Delta-Sigma Modulator.
Figure 2:
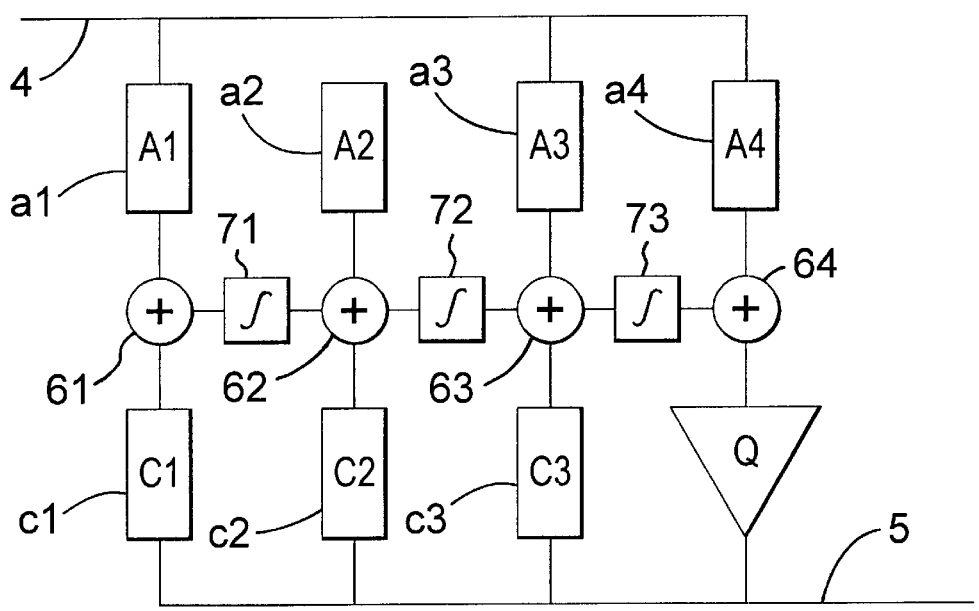
FIG. 2 is a block diagram of a previously proposed Delta-Sigma Modulator configured as an nth order filter section.
Figure 3:
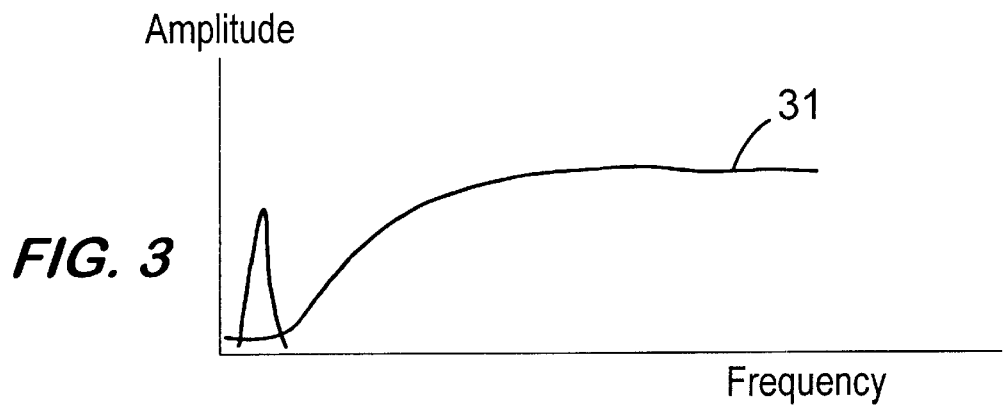
FIG. 3 shows a noise shaping characteristic.
Figure 4:
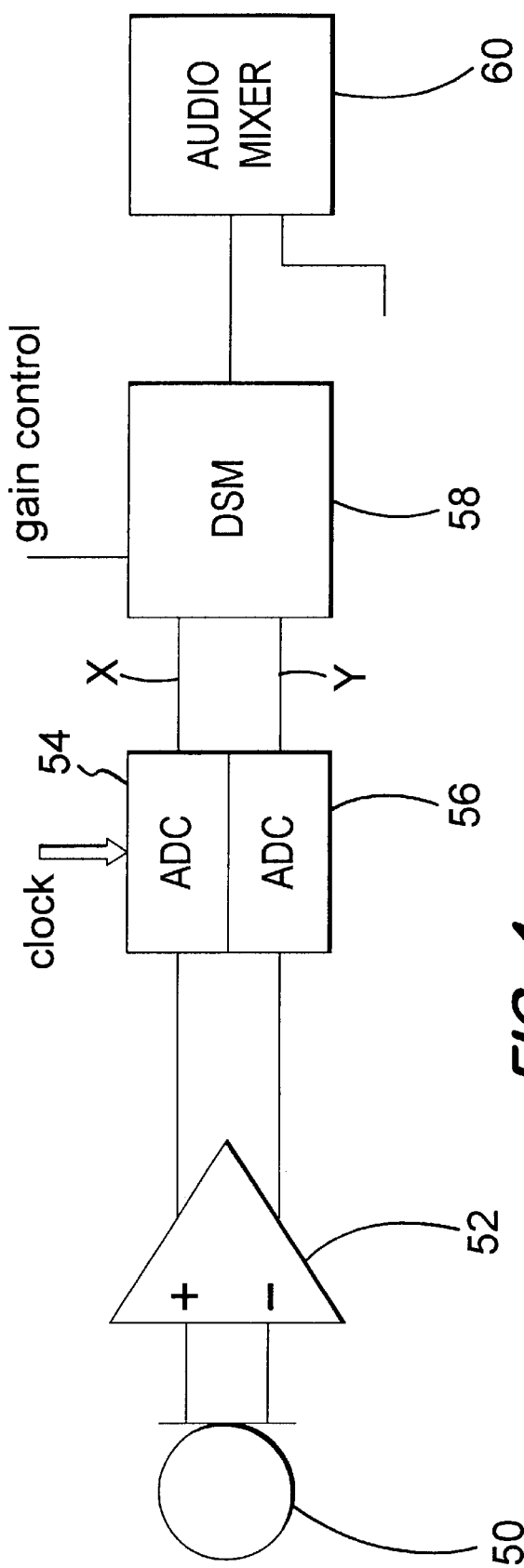
FIG. 4 is a schematic block diagram of an illustrative audio signal processor according to the invention.

Referring to FIG. 4, the audio signal processor comprises a differential microphone 50 which produces a differential pair of analogue signals which are amplified by a differential amplifier 52 which in this example has a fixed gain. The amplified analogue differential signals are converted to 1-bit form in respective 1-bit analogue to digital converters 54 and 56 to produce one bit differential signals X and Y. The two 1-bit signals are combined in a Delta Sigma Modulator 58 having a controllable gain to produce a non-differential 1-bit signal for use in for example a 1-bit audio mixer 60.

Figure 5:
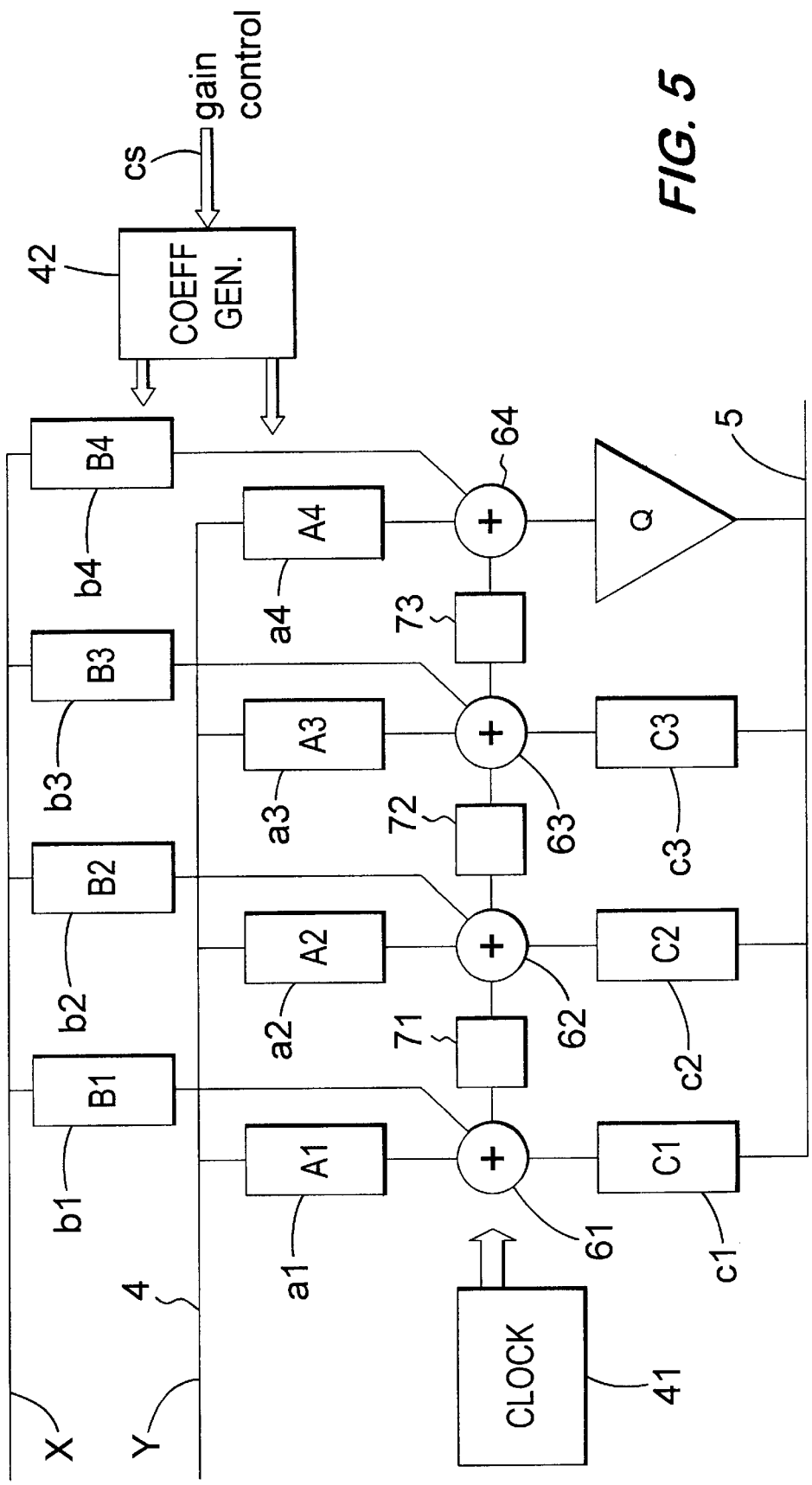
FIG. 5 is a schematic block diagram of a preferred signal combiner according to the present invention.

Referring to FIG. 5, the signal combiner comprises an nth order Delta-Sigma Modulator (DSM) where n is 2 or more. The example shown in a third order DSM (n=3) but n maybe greater than 3.

The order of the DSM is defined by the number of integrator sections. The DSM of FIG. 5, comprises a first section, n−1 intermediate sections and a final section. The first section comprises: an adder 61 having three inputs; a first coefficient multiplier $a_1$ connected to a first input Y of the DSM; a second coefficient multiplier $b_1$ connected to a second input X of the DSM; a third coefficient multiplier c1 connected to the output of the multiplier; and an integrator 71. The multipliers $a_1$ and $b_1$ and $c_1$ are 1-bit multipliers which multiply the 1-bit signals received thereby by p-bit coefficients A1, B1, C1 respectively. Each intermediate integrator section comprises: an adder 62, 63 having four inputs; an integrator 72, 73; a first coefficient multiplier $a_2$, $a_3$ connected to the first input of the DSM for multiplying the first 1-bit signal by a coefficient A2, A3; a second coefficient multiplier $b_2$, $b_3$ connected to the second input of the DSM for multiplying the second 1-bit signal by a coefficient B2, B3; and a third coefficient multiplier C2, C3 connected to the output of the DSM for multiplying the 1-bit output signal of the DSM by a third coefficient C2, C3. The adder 62, 63 adds the outputs of the multipliers $a_2$, $a_3$, $b_2$, $b_3$, $c_2$, $c_3$ to the output of the integrator of the preceding stage.

The final stage of the DSM comprises an adder 64 having three inputs; a first coefficient multiplier $a_4$ for multiplying the first input signal by a first coefficient A4; a second coefficient multiplier b4 for multiplying the second input signal by a second coefficient B4. The adder 64 adds the outputs of the multipliers $a_4$ and $b_4$ to the output of the integrator 73 of the preceding stage. The adder 64 has an output connected to a quantizer Q.

The multipliers $a_1$ to $a_4$, $b_1$ to $b_4$ and $c_1$ to $c_4$ are all 1-bit multipliers, which multiply each bit of the 1-bit signals applied to them by p bit coefficients to produce p bit multiplicands.

The adders 61 to 64 and the integrators 71 to 73 operate on the p bit signals.

The p bit signals are represented in twos complement form for example whereby positive and negative numbers are represented.

The quantizer Q is a comparator having a threshold level of zero. Negative inputs to the quantizer are encoded as −1 (logic 0) and positive inputs as +1 (logical 1), to produce the 1-bit output at output 5.

A local clock is provided by a clock circuit 41. Clock circuit 41 controls the clocking of the DSM in known manner.

The coefficients A1 to A4, B1 to B4 and C1 to C3 are chosen using the methods described in the above mentioned papers to provide
  a) circuit stability; and
  b) noise shaping.

The coefficients C1 to C3 have fixed values to provide the noise shaping.

The coefficient A1 to A6 and B1 to B4 define zeros of the transfer function of the input signals and thus control the gain applied to the signals.

In accordance with one embodiment of the present invention, the coefficients A1 to A4 and B1 to B4 are chosen to sum the first and signals in fixed proportions defined by the coefficients. The coefficients A1 to A4 equal corresponding coefficients B1 to B4 in magnitude. In one implementation of the invention, one of the signals X and Y is inverted relative to the other when it is produced at the source 50. Thus the addition is performed as a subtraction X−(−Y)= X+Y. In that case coefficients B=−A.

In accordance with another preferred embodiment of the present invention, the coefficients A1 to A4 and B1 to B4 are variable to allow the first and second signals to provide gain control. The variable coefficients A1 to A4, B1 to B4 are generated by a coefficient generator 42. Generator 42 maybe a coefficient store, storing sets of coefficients which are addressed by a variable addressing arrangement responsive to a control signal CS.

Alternatively the coefficients generator 42 maybe a micro computer which generates the coefficients in response to a control signal.

Where the coefficients A1 to A4, B1 to B4 and C1 to C4 are fixed, the combination of coefficient multipliers A1, B1, C1 and adders 61 in each stage of the DSM may be implemented by a look-up table stored in a ROM. For each coefficient A1, B1, C1 multiplied by a 1-bit signal there are only two results +A1, −A1, +B1, −B1 and +C1, −C1. The various additive combinations of these results are stored in a ROM, which is then simply addressed by the 1-bit signals.

Figure 6:
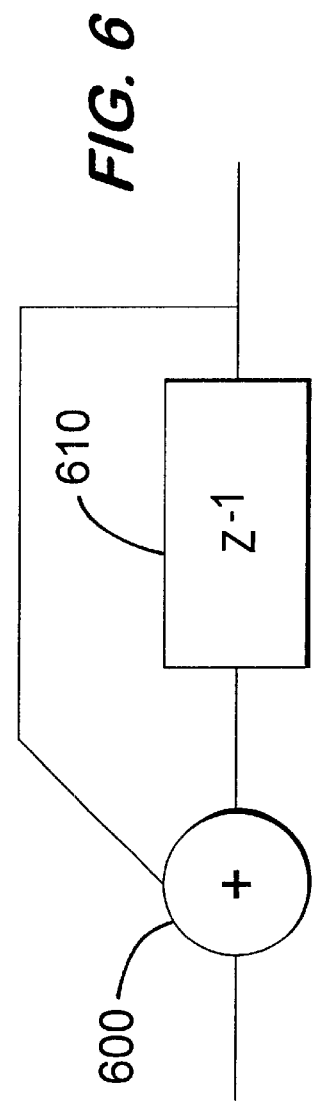
FIG. 6 is a schematic block diagram of an integrator of the combiner of FIG. 4.

For completeness FIG. 6 shows an example of an integrator 71, 72 or 72. The integrator comprises an adder 600 and a 1-bit delay element 610. The output of the delay element 610 is fed back to the adder to accumulate the integrator result. The adder 61, 62, 63 of each stage may also be used as the adder 600.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

CALCULATING COEFFICIENTS

This annex outlines a procedure for analysing a fifth order DSM and for calculating coefficients of a desired filter characteristic.

A fifth order DSM is shown in Figure A having coefficients a to f and A to E, adders 6 and integrators 7. Integrators 7 each provide a unit delay. The outputs of the integrators are denoted from left to right s to w. The input to the DSM is a signal x[n] where [n] denotes a sample in a clocked sequence of samples. The input to the quantizer Q is denoted y[n] which is also the output signal of the DSM. The analysis is based on a model of operation which assumes quantizer Q is simply an adder which adds random noise to the processed signal. The quantizer is therefore ignored in this analysis.

The signal y[n]=fx[n]+w[n] i.e. output signal y[n] at sample [n] is the input signal x[n] multiplied by coefficient f plus the output w[n] of the preceding integrator 7.

Applying the same principles to each output signal of the integrators 7 results in Equations set 1.

$$y[n]=fx[n]+w[n]$$

$$w[n]=w[n-1]+ex[n-1]+Ey[n-1]+v[n-1]$$

$$v[n]=v[n-1]+dx[n-1]+Dy[n-1]+u[n-1]$$

$$u[n]=u[n-1]+cx[n-1]+Cy[n-1]+t[n-1]$$

$$t[n]=t[n-1]+bx[n-1]+By[n-1]+s[n-1]$$

$$s[n]=s[n-1]+ax[n-1]+Ay[n-1]$$

These equations are transformed into z-transform equations as well known in the art resulting in equations set 2.

$$Y(z)=fx(z)+W(z)$$

$$W(z)(1-z^{-1})=z^{-1}(eX(z)+EY(z)+V(z))$$

$$V(z)(1-z^{-1})=z^{-1}(dX(z)+DY(z)+U(z))$$

$$U(z)(1-z^{-1})=z^{-1}(cX(z)+CY(z)+T(z))$$

$$T(z)(1-z^{-1})=z^{-1}(bX(z)+BY(z)+S(z))$$

$$S(z)(1-z^{-1})=z^{-1}(aX(z)+AY(z))$$

The z transform equations can be solved to derive Y(z) as a single function of X(z) (Equation 3)

$$Y(z) = fX(z) + \frac{z^{-1}}{(1-z^{1})}\left(eX(z) + EY(z) + \frac{z^{-1}}{1-z^{-1}}\left(dX(z) + DY(z) + \frac{z^{-1}}{1-z^{-1}}\left(cX(z) + CY(z) + \frac{z^{-1}}{1-z^{-1}}\left(bX(z) + BY(z) + \frac{z^{-1}}{1-z^{-1}}(aX(z) + AY(z))\right)\right)\right)\right)$$

This may be reexpressed as shown in the right hand side of the following equation, Equation 4. A desired transfer function of the DSM can be expressed in series form $$\frac{Y(z)}{X(z)}$$

given in left hand side of the following equation and equated with the right hand side in Equation 4.

$$\frac{Y(z)}{X(z)} = \frac{\alpha_0 + \alpha_1 z^{-1} + \alpha_2 z^{-2} + \alpha_3 z^{-3} + \alpha_4 z^{-4} + \alpha_5 z^{-5}}{\beta_0 + \beta_1 z^{-1} + \beta_2 z^{-2} + \beta_3 z^{-3} + \beta_4 z^{-4} + \beta_5 z^{-5}} =$$

$$\frac{f(1-z^{-1})^5 + z^{-1}e(1-z^{-1})^4 + z^{-2}d(1-z^{-1})^3 + z^{-3}c(1-z^{-1})^2 + z^{-4}b(1-z^{-1}) + z^{-5}a}{(1-z^{-1})^5 - z^{-1}E(1-z^{-1})^4 - z^{-2}D(1-x^{-1})^3 - z^{-3}C(1-z^{-1})^2 - z^{-4}B(1-z^{-1}) - Z^{-5}A}$$

Equation 4 can be solved to derive the coefficients f to a from the coefficients $\alpha_0$ to $\alpha_5$ and coefficients E to A from the coefficients $\beta_0$ to $\beta_5$ as follows noting that the coefficients $\alpha_n$ and $\beta_n$ are chosen in known manner to provide a desired transfer function.

f is the only $z^0$ term in the numerator. Therefore $f=\alpha_0$.

The term $\alpha_0(1-z^{-1})^5$ is then subtracted from the left hand numerator resulting in $\alpha_0 + \alpha_1 z^{-1} \ldots + \ldots \alpha_5 z^{-5} - \alpha_0(1-z^{-1})^5$ which is recalculated.

Similarly $f(1-z^{-1})^5$ is subtracted from the right hand numerator. Then e is the only $z^{-1}$ term and can be equated with the corresponding $\alpha_1$ in the recalculated left hand numerator.

The process is repeated for all the terms in the numerator.

The process is repeated for all the terms in the denominator.

We claim:

1. A signal processor having a pair of inputs for receiving first and second analogue signals which are a differential pair of signals, a pair of 1-bit analogue to digital converters coupled to the respective inputs to convert the first and second signals to 1-bit digital form, and a Delta Sigma Modulator having a pair of inputs coupled to receive the respective first and second 1-bit signals for combining the differential pair to form a non-differential 1-bit signal.

2. A processor according to claim 1, further comprising an analogue differential amplifier coupling the first and second signals to the respective inputs of the Delta Sigma Modulator.

3. A processor according to claim 1, further comprising a differential signal source for producing the first and second analogue signals.

4. A processor according to claim 3, wherein the signal source is a microphone.

5. A signal processor according to claim 1, wherein the Delta Sigma Modulator is an nth order (where n is greater than or equal to 1) Delta Sigma Modulator (DSM) having a first input for receiving the first 1-bit signal, a second input for receiving the second 1-bit signal, a quantizer for requantizing a p bit signal to 1-bit form the requantized signal being the output signal of the processor, a plurality of signal combiners including a first combiner for forming an integral of an additive combination of the product of the first signal and a first coefficient and of the product of the second signal and a second coefficient and of the product of the output signal and a third coefficient, at least one intermediate combiner for forming an integral of an additive combination of the product of the first signal and a first coefficient and of the product of the second signal and a second coefficient and of the product of the output signal and a third coefficient and of the integral of the preceding stage, and a final combiner for forming an additive combination of the product of the first signal and a first coefficient and of the product of the second signal and a second coefficient and of the integral of the preceding stage to form the said p bit signal which is requantized by the quantizer.

6. A processor according to claim 5, wherein the said first coefficients and the said second coefficients are equal in magnitude.

7. A processor according to claim 5, wherein the third coefficients are chosen to provide noise shaping.

8. A processor according to claim 5, wherein the first and second coefficients are variable.

9. A processor according to claim 8, further comprising means for generating the variable coefficients.

10. A processor according to claim 5, wherein the first and second coefficients are fixed.

11. A processor according to claim 10, wherein the combining means comprises a look-up table.

12. An audio signal processor comprising a signal processor according to claim 1.

* * * * *